United States Patent [19]

Suzuki et al.

[11] 4,281,395
[45] Jul. 28, 1981

[54] MAGNETIC BUBBLE MEMORY DEVICE

[75] Inventors: Ryo Suzuki, Kokubunji; Atsushi Asano, Tokyo; Masatoshi Takeshita, Hachioji; Teruaki Takeuchi, Kokubunji, all of Japan

[73] Assignee: Hitachi, Ltd., Tokyo, Japan

[21] Appl. No.: 973,819

[22] Filed: Dec. 28, 1978

[30] Foreign Application Priority Data

Jan. 6, 1978 [JP] Japan ............................ 53/211

[51] Int. Cl.³ ............................ G11C 19/08
[52] U.S. Cl. ............................ 365/15; 365/8; 365/11; 365/12
[58] Field of Search .................... 365/8, 11, 15, 12

[56] References Cited
U.S. PATENT DOCUMENTS 4,070,659  1/1978  Bullock ........................ 365/15
4,120,042  10/1978  Kasai ........................... 365/11

Primary Examiner—James W. Moffitt
Attorney, Agent, or Firm—Craig and Antonelli

[57] ABSTRACT

The magnetic bubble memory device of this invention is arranged such that a magnetic bubble detector and a nucleation type magnetic bubble generator in a chip are made to operate at different phases of the same operation cycle of a rotating magnetic field. Therefore, the operation time of the magnetic bubble detector and the operation time of the nucleation type magnetic bubble detector are completely separated from each other, although they are involved by the same cycle of operation of the rotating magnetic field. Consequently, the magnetic bubble detector can perform the detecting operation, without being affected by large amounts of noise which are generated during the operation of the nucleation type magnetic bubble generator.

8 Claims, 27 Drawing Figures

MAGNETIC BUBBLE MEMORY DEVICE

BACKGROUND OF THE INVENTION

1. Field of the Invention

The present invention relates to a magnetic bubble memory device and, more particularly, to an improvement in arrangement of magnetic bubble detector and magnetic bubble generator relative to each other in the memory device of the kind mentioned above.

2. Description of the Prior Art

The magnetic bubble memory device has been well known to those skilled in the art. One mode of operation of such a memory device is called "field access". This is because the movement of the magnetic bubble in a film of bubble material is made in response to a drive field which rotates in the plane of the film.

In a typical case, the film is made of an epitaxial film of garnet. The magnetic bubble moves in the film along a propagation path which is determined by the periodic pattern of a magnetically soft element (high permeability), typically permalloy. This element produces a magnetic pole pattern in response to the drive field rotating in the plane of the film, which in turn forms a localized field gradient by which the magnetic bubble is moved.

This type of magnetic bubble memory device is usually constructed in the form of a "major-minor loops" organization. In the memory device of this type, as is well known, the information is written and read in and out of data block unit, and the time regions for writing and reading operations are completely separated from each other.

Recently, there has been proposed a block type replicator/transfer gate, as in the AIP Conference Proceedings No. 18 P100-104 (1974), P. I. Bonyhard et al., which conveniently affords a major line/minor loops organization. Consequently, it has become possible to easily effect the reading and writing operations in the same time region. Clearly, it is more advantageous to make the reading and writing operations in the same time region than in the separate time regions.

FIG. 1 shows an example of memory organization capable of performing the reading and writing, e.g. transfer-out and transfer-in, operations in the same time region. The magnetic bubble generated by a magnetic bubble generator 2 provided on a magnetic bubble memory chip 1 is moved along the transfer in major line 3, in response to a rotating magnetic field. As a data block in which the "presence" and "absence" of the magnetic bubble correspond to "1" and "0" of binary notation has reached each transfer-in gate 4 on the major line 3, the magnetic bubble is transferred to the minor loop 7, by a delivery of a pulse from a transfer pulse source 5 to a conductor 6. This is the theory of the transfer-in operation. The magnetic bubble on the minor loop 7 is recirculated along this loop in accordance with the rotating magnetic field.

As to the reading operation, when the address to be read out on the minor loop has reached a position corresponding to the transfer-out gate 9 of a major line 8, the magnetic bubble on the minor loop 7 is replicated and transferred to a major line 8, by a delivery of a replicating pulse from a replicate/transfer out pulse source 10 to a conductor 17. The magnetic bubble on the major line 8 is moved in response to the rotating magnetic field and finally reaches a magnetic bubble detector 11, where the "presence" or "absence" of the magnetic bubble is transformed into an electric signal corresponding to "1" or "0" of binary notation.

The rewriting operation for rewriting the information in an address on the minor loop 7 is conducted in the following manner. When the address on the minor loop 7 to be rewritten has reached the position corresponding to the transfer-out gate of the major line 8, the magnetic bubble on the minor loop 7 is transferred to the major line 8, as the transfer pulse coming from the replicate/transfer pulse source 10 is delivered to the conductor 17. As a result, this address on the minor loop 7 becomes a vacant address in which there is no magnetic bubble. The new information is written in this vacant address, as the latter is brought to the position corresponding to the transfer-in gate 4.

There are two cases of rewriting: the rewriting of the whole content of the block and a partial rewriting. In either case, the old information which has been read out from the minor loop 7 and transferred to the major line 8 is moved in accordance with the rotating magnetic field to the magnetic bubble detector 11, and is erased after a detection by the detector 11. The output of the detector 11 corresponding to the old information may be used as a confirmation and check. Particularly, when only a part of the content of the data block is to be rewritten, the detecting output from the magnetic bubble detector 11 is fed back to the magnetic bubble generator 2 which produces the same information as the fed back output, and the information is renewed only in the address to be rewritten.

Therefore, in order to shorten the time required for the rewriting, it is necessary to overlap the time regions for the transfer-out and transfer-in operations.

However, the magnetic bubble generator, which is usually of the nucleation type, produces a large amount of noise when the transfer-in and transfer-out operations are performed in the overlapped time regions, so as to adversely affect the detector 11. Consequently, the output from the magnetic bubble detector 11 involves a large amount of noise which makes it difficult to discriminate between the "presence" and "absence" of the magnetic bubble.

SUMMARY OF THE INVENTION

It is therefore an object of the invention to provide a magnetic bubble memory device in which the problem attributable to the noise produced by the nucleation type magnetic bubble generator is avoided, so as to allow a superposition of the time regions for the operations of the magnetic bubble generator and the magnetic bubble detector.

The unfavourable influence of the noise produced by the nucleation type magnetic bubble generator on the magnetic bubble detector can be avoided by arranging that the generator and the detector do not operate simultaneously. The operation time of the generator, as well as that of the detector, occupies only a small part (one tenth or smaller) of the period of one cycle of rotation of the rotating magnetic field.

It is therefore possible to make the generator and the detector operate in the same cycle of rotation of the rotating magnetic field but in different phases.

Because of the characteristics inherent in the generator and the detctor, how they may be constructed, they have to be actuated when the rotating magnetic field is oriented in specific directions. In other words, it is possible to differentiate the orientations of the rotating magnetic field at which the generator and the detector are actuated, respectively, by differentiating the directions of the generator and the detector. On the other hand, the positional relation between the generator and the detector is by no means limited, and can optionally be changed by suitably arranging the propagation path for the magnetic bubble.

It is therefore possible, by suitably determining the directions of the nucleation type bubble generator and the magnetic bubble detector such that they are actuated at different orientations of the rotating magnetic field, to drive the generator and the detector in the same operation cycle of the rotating magnetic field, without being accompanied by bad influence upon the operation of the magnetic bubble detector. This in turn offers the great advantage of a highly reliable and rapid rewriting of information.

DESCRIPTION OF THE PREFERRED EMBODIMENTS

Figure 1:
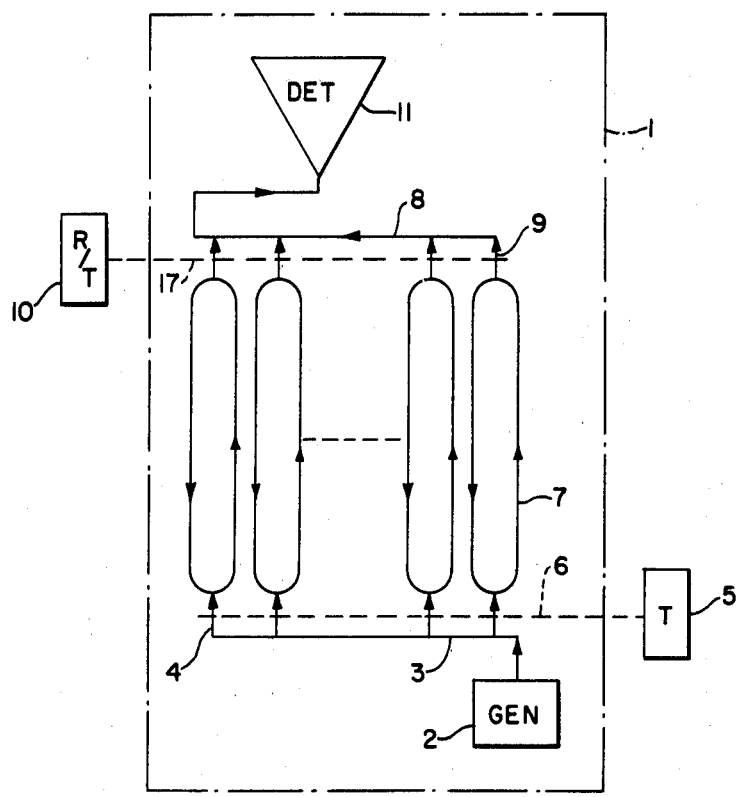
FIG. 1 shows an example of magnetic bubble memory device capable of performing the reading and writing operations in the same time region.
Figure 2A:
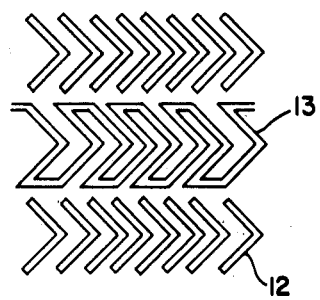
FIGS. 2A to 2G show arrangements of a magnetic bubble generator and a magnetic bubble detector in accordance with the invention, FIGS. 3A and B in FIGS. 4A to 4F show, respectively, different arrangements of the generator and detector in accordance with the invention.
Figure 2B:
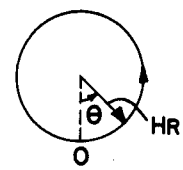
Figure 5:
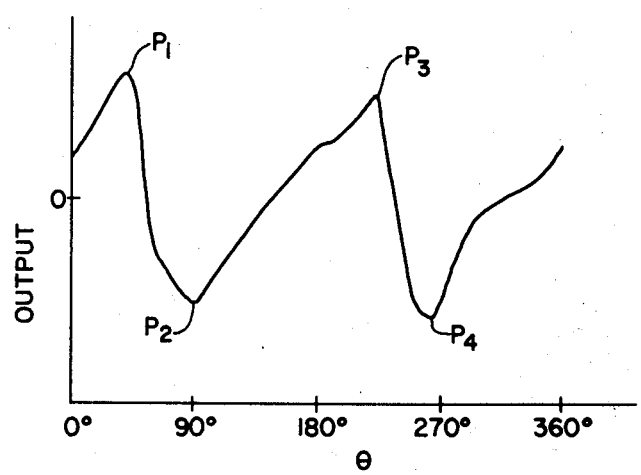
FIG. 5 is a graphical representation of output signal from the detector as shown in FIG. 2A.

FIG. 2A is an enlarged view of a part of a chevron expander type detector which is used as the detector 11 in the memory device shown in FIG. 1. This type of detector has been disclosed in the specifications of U.S. Pat. Nos. 3,702,995 and 3,713,120. The angle of counter-clockwise rotation of the rotating magnetic field $H_R$ from the bottom center (zero) is represented by $\theta$, as shown in FIG. 2B. The magnetic bubble is gradually enlarged as it moves from the lower part to the upper part of a stage consisting of a plurality of chevron elements 12 as shown in FIG. 2A, and then moves across a detector stage 13. The wave form of the detecting output in this state is shown at FIG. 5. As will be seen from FIG. 5, the wave form of the detecting output includes four peaks P1, P2, P3 and P4. It is possible to examine the presence or absence of the magnetic bubble by making use of one of these peaks.

Figure 2C:
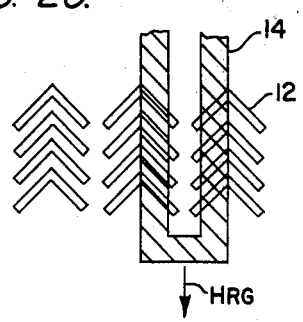

FIG. 2C is an enlarged view of a generator constituted by chevron elements 12, used as the nucleation type magnetic bubble generator as shown in FIG. 1.

This generator is adapted to locally invert the biasing magnetic field by applying a pulse current to a hairpin-shaped conductor 14, when the rotating magnetic field $H_R$ is orientated to the bottom, i.e. when the angle $\theta$ is zero, thereby to produce a magnetic bubble. The amplitude of the pulse current is usually 200 to 400 mA.

Therefore, according to the invention, the location of the magnetic bubble generator as shown in FIG. 2C is varied depending which one of the peaks of the detecting output is used for the examination of the presence or absence of the magnetic bubble. In the memory device of the invention, it is necessary that the orientation of the rotating magnetic field $H_R$ at which the generator is actuated and the orientation of the same at which the magnetic bubble is detected by the detector do not coincide with each other.

Table 1 shows the allowable direction or angular position of the generator for each peak of detecting output used for the examination of the presence of the magnetic bubble. In this table, the direction or angular position of the generator ($\theta$) is determined as follows. Assuming that the magnetic bubble memory chip is placed such that the detector is viewed as shown in FIG. 2A, the direction or angular position of the generator in the same chip is 0°, when the generator is viewed as shown in FIG. 2C. The angular deviation in the counter-clockwise direction of the generator from the position of 0° is represented by $\theta$. Thus, the definition of direction of the generator is identical to that of the rotating magnetic field $H_R$ as shown in FIG. 2B.

TABLE 1

| peak used for examination | allowable direction of generator ($\theta$) |
|---|---|
| first peak P1 | 90°–360° |
| second peak P2 | 0°–40°, 140°–360° |
| third peak P3 | 0°–170°, 270°–360° |
| fourth peak P4 | 0°–230°, 300°–360° |

Figure 2D:
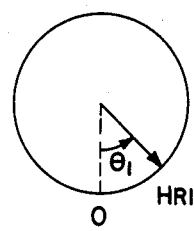
Figure 2E:
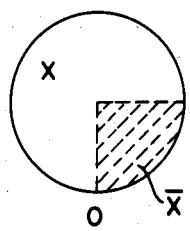

FIG. 2D is an illustration of the orientation $H_{R1}$ at which the peak P1 of the detecting output as shown in FIG. 5 is generated. The angle of rotation is about 45°. It is therefore desirable, taking into account the fluctuation of the phase of the strobe pulse, as well as the time required for the attenuation of the noise of generator, not to drive the generator at an angular range of 45° at each side of the rotation angle $\theta_1$. This situation is shown at FIG. 2E, in which the angular range over which the operation of the generator is allowed is an allowable region X, while $\overline{X}$ represents the region over which the operation of the generator is prohibited. Namely, the angle $\theta$ of the region X over which the operation of the generator is allowed is between 90° and 360°.

Figure 2F:
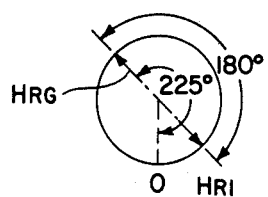
Figure 2G:
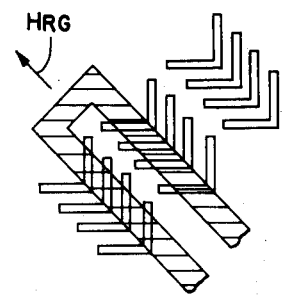

The positional relationship between the detector and the generator, which is taken when the angle $\theta$ is 225°, is shown in FIGS. 2F and 2G. By positioning the generator as shown in FIG. 2G, the generator and the detector can be operated in the same rotation cycle of the rotating magnetic field, while avoiding the unfavorable influence of the noise of the generator on the detector.

Taking into account the fluctuations of phases of various pulses, the optimum arrangement is such that the generator is driven at an orientation of the rotating magnetic field, 180° apart from that at which the detector is operated.

It has been confirmed that the S/N ratio of the detecting output obtained when the transfer-out and transfer-in operations are performed in the same time region, by adopting the positional relationship as shown in Table 1 between the generator and detector, is substantially identical to that obtained when the transfer-out operation is performed solely.

Figure 3A:
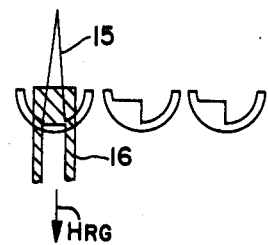

Hereinunder, a description will be made as to an arrangement in which, a chevron expander type detector similar to that of FIG. 2A, is used as the detector, while, as shown in FIG. 3A, a generator having a pickax type element 15 is used as the generator. The generator as shown in FIG. 3A is adapted to deliver a pulse current to a hairpin-shaped conductor 16, so as to generate a magnetic bubble, when the rotating magnetic field $H_R$ is oriented to the bottom ($\theta = 0$). Therefore, the direction of the generator in the same chip is defined as 0°, if the generator is viewed as shown in FIG. 3A. Then, the allowable angular range of the generator is identical to that in table 1.

Figure 3B:
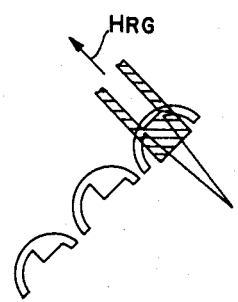

When the peak P3 of the four peaks of the wave form of detecting output as shown in FIG. 5 is used for examining for the presence or absence of the magnetic bubble, the positional relationship between the detector and the generator, adopted when the angle $\theta$ is 225°, is shown in FIG. 3B. It will be seen that the detector can operate without being affected by the noise from the generator, even when the generator and the detector are made to operate in the same rotation cycle of the rotating magnetic field, if the generator is located as shown in FIG. 3B. The optimum arrangement is, as stated before, such that the generator is made to operate at an orientation of the rotating magnetic field which is 180° apart from that at which the detector operates.

It was confirmed that the S/N ratio of the detected output obtained when the transfer-out and transfer-in operations are performed in the same time region, with the generator of FIG. 3A located as instructed by table 1, is materially equivalent to that obtained when only the transfer-out operation is performed.

Figure 4A:
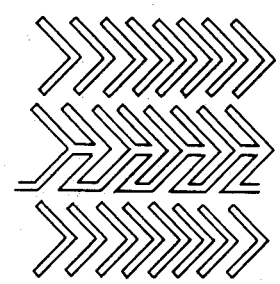
Figure 4B:
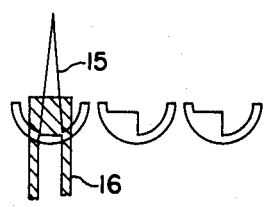

Hereinafter, an explanation will be made as to the arrangement in which, as shown in FIG. 4B, a generator consisting of a pickax type element 15 similar to that of FIG. 3A is used as the generator, while the detector is constituted, as shown in FIG. 4A, by a chevron expander type detector.

Figure 4C:
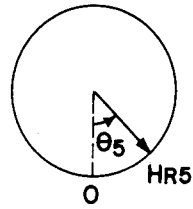
Figure 6:
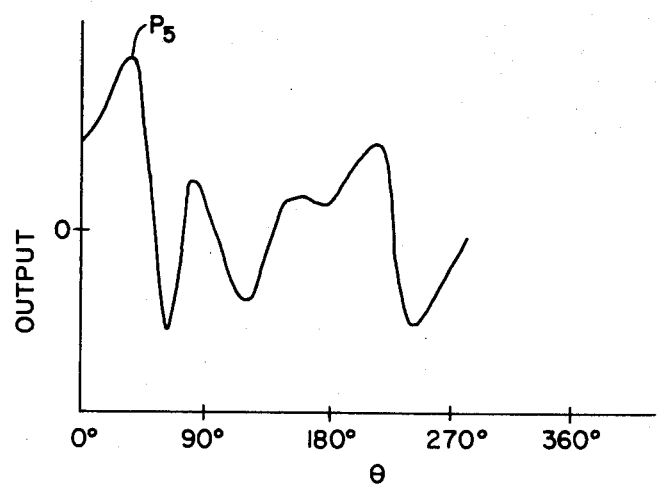
FIG. 6 is a graphical representation of output signal from the detector as shown in FIG. 4A.

This type of detector is disclosed in the specification of U.S. Pat. No. 4,019,177. This detector has a wave form as shown by a curve in FIG. 6. As will be seen from FIG. 6, there is only one peak available for use as the signal for detecting the magnetic bubble. This peak will be referred to as the peak P5, hereinafter. The peak P5 is generated when the angle $\theta_5$ is about 45°. This situation is shown in FIG. 4C.

Assuming that the magnetic memory chip is placed such that the detector is viewed as shown in FIG. 4A, the direction of the generator in the same chip is defined as 0°, when the generator is viewed as shown in FIG. 4B. The direction of the generator is represented by the angle of deviation in counterclockwise direction from the position of 0°. Thus, the allowable angular range $\theta$ for the generator is between 90° and 360°. As stated above, the angle $\theta$ of the region Z of direction in which the operation of the generator is allowed is between 90° and 360°.

Figure 4D:
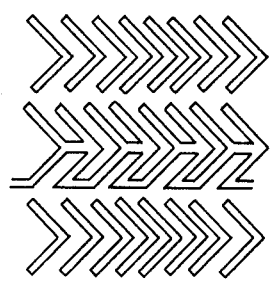
Figure 4E:
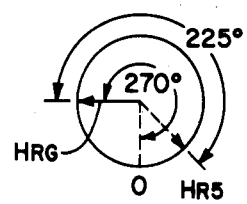
Figure 4F:
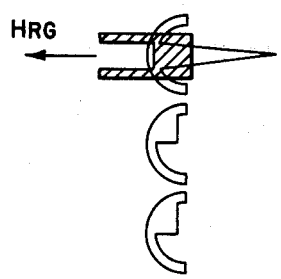

FIGS. 4D to 4F show the positional relationship between the detector and the generator, adopted when the angle $\theta$ is 270°. It will be seen that the detector can operate without being affected by the noise from the generator, even when the generator and the detector are made to operate in the same rotational cycle of the rotating magnetic field, if the generator is located as shown in FIG. 4F in relation to the detector located as shown in FIG. 4D.

As stated before, the optimum direction of the generator is such that the generator operates in the orientation ($\theta \simeq 225°$) of the rotating magnetic field 180° spaced from that ($\theta \simeq 45°$) at which the detector operates.

It was confirmed that the S/N ratio of the detected output obtained when the transfer-out and transfer-in operations are effected in the same time region, with the detector of FIG. 4A and the generator of FIG. 4B arranged in the above-specified angular range, is materially identical to that obtained when only the transfer-out operation is performed.

It is preferred, in all of the described embodiments, to operate the detector in the earlier half of the allowable angular range of operation.

As has been described in detail, in the magnetic bubble memory device of the invention, the orientation of the rotating magnetic field at which the magnetic bubble detector is made to operate and the orientation of the rotating magnetic field at which the nucleation type bubble generator is made to operate are different from each other. It is therefore possible to completely separate the time regions for the transfer-out and transfer-in operations which are performed in the same operation cycle of the rotating magnetic field. Consequently, the transfer-out operation is performed without being affected by the noise produced in the course of the transfer-in operation. This in turn ensures a highly reliable and rapid rewriting of the information.

What is claimed is:

1. A magnetic bubble memory device comprising: a layer of magnetic material in which a magnetic bubble is movable in response to the rotation of a rotating magnetic field; a plurality of minor loops provided on said layer, each minor loop having first and second ends; a first major line connected through a first gate to at least one of said first ends of said minor loops; a nucleation type magnetic bubble generator provided at one end of said first major line; a second major line connected through a second gate to at least a said second end of said minor loops; and a magnetic bubble detector provided at the other end of said second major line; wherein said generator is arranged by geometrical rotation with respect to said detector in a chip to operate said generator and said detector at different phases in the same cycle of rotation of said rotating magnetic field.

2. A magnetic bubble memory device as claimed in claim 1, wherein the difference between said phases is 180°.

3. A magnetic bubble memory device as claimed in claim 1, wherein said magnetic bubble detector is of chevron expander type.

4. A magnetic bubble memory device as claimed in claim 1, wherein said nucleation type magnetic bubble generator comprises a pickax type element.

5. A magnetic bubble memory device as claimed in claim 1, wherein said magnetic bubble detector is of chevron expander type, while said magnetic bubble generator is of pickax type.

6. A magnetic bubble memory device as claimed in claim 5, wherein the difference between said phases is 180°.

7. A magnetic bubble memory device as claimed in claim 5, wherein said magnetic bubble detector is of chevron expander type wherein the detected output appears only in a range of 0° to 90° of the phase of rotation of said rotating magnetic field, while said magnetic bubble generator is of pickax type that is arranged at rotation angles except for a range of 0° to 90° of the phase of rotation of said rotating magnetic field.

8. In a magnetic bubble memory system comprising a layer of magnetic material in which a magnetic bubble is movable in response to the rotation of a rotating magnetic field; a plurality of minor loops provided on said layer, each minor loop having first and second ends; a first major line connected through a first gate to at least one of said first ends of said minor loops; a nucleation type magnetic bubble generator provided at one end of said first major line; a second major line connected through a second gate to at least a said second end of said minor loops; and a magnetic bubble detector provided at the other end of said second major line; the improvement comprising:

means to reduce output by said detector attributable to noise produced by said generator by disposing said generator to be geometrically rotated with respect to said detector for operating said generator and said detector at different phases in the same cycle of rotation of said rotating magnetic field.

* * * * *